(12) United States Patent
Wood (10) Patent No.: US 10,151,542 B2
(45) Date of Patent: Dec. 11, 2018

(54) ENCAPSULATED PHASE CHANGE MATERIAL HEAT SINK AND METHOD

(71) Applicant: Raytheon Company, Waltham, MA (US)

(72) Inventor: Adam C. Wood, Oro Valley, AZ (US)

(73) Assignee: Raytheon Company, Waltham, MA (US)

( * ) Notice: Subject to any disclaimer, the term of this patent is extended or adjusted under 35 U.S.C. 154(b) by 291 days.

(21) Appl. No.: 14/244,640

(22) Filed: Apr. 3, 2014

(65) Prior Publication Data

US 2015/0285564 A1 Oct. 8, 2015

(51) Int. Cl.
*F28D 20/02* (2006.01)
*B23P 15/26* (2006.01)
(Continued)

(52) U.S. Cl.
CPC ............ *F28D 20/021* (2013.01); *B23P 15/26* (2013.01); *F28D 20/023* (2013.01); *F28F 3/022* (2013.01); *H01L 23/4275* (2013.01); *F28D 15/046* (2013.01); *F28D 17/00* (2013.01); *F28D 17/04* (2013.01); *F28D 2020/0008* (2013.01); *F28D 2020/0013* (2013.01); *F28D 2020/0017* (2013.01); *F28D 2020/0021* (2013.01); *F28D 2020/0026* (2013.01);
(Continued)

(58) Field of Classification Search
CPC ..... F28D 2020/0017; F28D 2020/0013; F28D 2020/0008; F28D 2020/0021; F28D 2020/0026; F28D 20/21; F28D 15/046; F28D 17/00; F28D 17/04; B23P 15/26; Y02E 60/145

USPC ...................................... 165/10, 104.17, 100
See application file for complete search history.

(56) References Cited

U.S. PATENT DOCUMENTS 3,519,067 A * 7/1970 Schmidt ................ F28D 15/046
165/104.26
4,259,401 A 3/1981 Chahroudi et al.
(Continued)

FOREIGN PATENT DOCUMENTS

GB 2474578 A 4/2011
JP 2001174085 A 6/2001
(Continued)

OTHER PUBLICATIONS

International Search Report and Written Opinion dated Apr. 30, 2015 in connection with International Application PCT/US2015/014045; 10 pages.
(Continued)

*Primary Examiner* — Jianying Atkisson
*Assistant Examiner* — Joel Attey (57) ABSTRACT

According to an embodiment of the disclosure, an encapsulated phase change material (PCM) heat sink is provided. The encapsulated PCM heat sink includes a lower shell, an upper shell, an encapsulated phase change material, and an internal matrix. The internal matrix includes a space that is configured to receive the encapsulated phase change material. Thermal energy is transferrable between the encapsulated phase change material and at least one of the lower shell and the upper shell. For a particular embodiment, the upper shell is coupled to the lower shell at room temperature and room pressure.

20 Claims, 6 Drawing Sheets

(51) Int. Cl.
  *F28F 3/02* (2006.01)
  *H01L 23/427* (2006.01)
  *F28D 20/00* (2006.01)
  *F28D 15/04* (2006.01)
  *F28D 17/04* (2006.01)
  *F28D 17/00* (2006.01)
  *F28D 21/00* (2006.01)

(52) U.S. Cl.
  CPC .......... *F28D 2021/0029* (2013.01); *H01L 2924/0002* (2013.01); *Y02E 60/145* (2013.01); *Y10T 29/4935* (2015.01)

(56) References Cited

U.S. PATENT DOCUMENTS

| | | | |
|---|---|---|---|
| 4,928,448 A * | 5/1990 | Phillip | E06B 3/6612 29/462 |
| 5,788,178 A | 8/1998 | Barrett, Jr. | |
| 6,474,593 B1 | 11/2002 | Lipeles et al. | |
| 6,584,332 B2 | 6/2003 | Yoshitake et al. | |
| 6,847,113 B2 | 1/2005 | Nakanishi et al. | |
| 6,854,513 B2 * | 2/2005 | Shirota | B60H 1/005 165/10 |
| 6,959,753 B1 | 11/2005 | Weber et al. | |
| 7,069,975 B1 | 7/2006 | Haws et al. | |
| 7,416,017 B2 | 8/2008 | Haws et al. | |
| 7,628,352 B1 | 12/2009 | Low et al. | |
| 7,781,709 B1 | 8/2010 | Jones et al. | |
| 7,834,301 B2 | 11/2010 | Clingman | |
| 7,891,298 B2 | 2/2011 | Minick et al. | |
| 7,999,212 B1 | 8/2011 | Thiesen et al. | |
| 2002/0033247 A1 * | 3/2002 | Neuschutz | F28D 20/02 165/10 |
| 2009/0040726 A1 * | 2/2009 | Hoffman | B22F 3/20 361/700 |
| 2009/0184283 A1 * | 7/2009 | Chung | C09K 5/063 252/67 |
| 2009/0211732 A1 * | 8/2009 | Goenka | B60H 1/00328 165/104.17 |
| 2010/0147152 A1 * | 6/2010 | Kosugi | B01D 53/0415 96/146 |
| 2011/0284188 A1 * | 11/2011 | Cai | F28D 15/0266 165/104.26 |
| 2012/0240919 A1 | 9/2012 | Baumann | |

FOREIGN PATENT DOCUMENTS

| | | |
|---|---|---|
| JP | 2002057262 A | 2/2002 |
| JP | 2004111665 A | 4/2004 |
| JP | 2004293984 A | 10/2004 |
| JP | 2009303316 A | 12/2009 |
| JP | 2012033812 A | 2/2012 |
| WO | WO 2008/044256 A1 | 4/2008 |
| WO | WO 2011/046940 A1 | 4/2011 |

OTHER PUBLICATIONS

"M982 Excalibur"; retrieved from http://en.wikipedia.org/w/index.php?title=Excalibur&oldid=638243770; 8 pages.
"Extreme Accuracy Tasked Ordance (EXACTO)"; retrieved from http://www.darpa.mil/Our_Work/TTO/Programs/Extreme_Accuracy_Tasked_Ordnance_%28EXACTO%29.aspx; 2 pages.
"EXACTO Demonstrates First-Ever Guided .50 Caliber Bullets"; retrieved from http://www.darpa.mil/NewsEvents/Releases/2014/07/10a.aspx; Jul. 10, 2014; 2 pages.
"Sandia's Self-Guided Bullet Prototype Can Hit Target a Mile Away"; Sandia Labs News Release; Jan. 30, 2012; 3 pages.
"3D Printing", Wikipedia, Oct. 28, 2015, 35 pages.
Foreign Communication from Related Counterpart Application; Japanese Application No. 2016-560513; Japanese Office Action dated Oct. 3, 2017; 3 pages.

* cited by examiner

ENCAPSULATED PHASE CHANGE MATERIAL HEAT SINK AND METHOD

TECHNICAL FIELD

The present disclosure is directed, in general, to thermal technology and, more specifically, to an encapsulated phase change material heat sink and method.

BACKGROUND OF THE DISCLOSURE

Phase change material heat sinks are capable of increasing thermal capacitance per volume/mass as compared to typical metallic heat sinks. However, due to the possible leakage of the phase change material, containing the phase change material within a heat sink generally requires sealing that is most effectively accomplished by creating a pressure vessel to contain the phase change material, which is generally expensive and time consuming.

SUMMARY OF THE DISCLOSURE

This disclosure provides an encapsulated phase change material (PCM) heat sink and method.

In one embodiment, an encapsulated PCM heat sink is provided that includes a lower shell, an upper shell, an encapsulated phase change material, and an internal matrix. The internal matrix includes a space configured to receive the encapsulated phase change material. Thermal energy is transferrable between the encapsulated phase change material and at least one of the lower shell and the upper shell. For a particular embodiment, the upper shell is coupled to the lower shell at room temperature and room pressure.

In another embodiment, an encapsulated PCM heat sink is provided that includes an encapsulated wax powder, an internal matrix, a lower shell, and an upper shell. The internal matrix includes a space configured to receive the encapsulated wax powder. The lower shell includes a raised edge that is configured to form a cavity. The cavity is configured to receive the internal matrix and the encapsulated wax powder. The upper shell is coupled to the raised edge of the lower shell. For a particular embodiment, the upper shell is coupled to the raised edge of the lower shell at room temperature and room pressure.

In yet another embodiment, a method for forming an encapsulated PCM heat sink is provided. The method includes inserting an encapsulated phase change material into a lower shell. The encapsulated phase change material is covered with an upper shell and is received within a space of an internal matrix. The upper shell is coupled to the lower shell at room temperature and room pressure.

Other technical features may be readily apparent to one skilled in the art from the following figures, descriptions, and claims.

BRIEF DESCRIPTION OF THE DRAWINGS

For a more complete understanding of the present disclosure, reference is now made to the following description taken in conjunction with the accompanying drawings, in which.

DETAILED DESCRIPTION

FIGS. 1 through 7, discussed below, and the various embodiments used to describe the principles of the present disclosure in this patent document are by way of illustration only and should not be construed in any way to limit the scope of the disclosure. Those skilled in the art will understand that the principles of the present disclosure may be implemented using any number of techniques, whether currently known or not. Additionally, the drawings are not necessarily drawn to scale.

As described above, containing a phase change material (PCM) within a heat sink generally requires sealing that is most effectively accomplished by creating a pressure vessel to contain the PCM. For example, paraffin wax is sealed in an aluminum container to form one type of PCM heat sink that typically uses vacuum brazing and high pressure seal plugs to prevent the paraffin wax from escaping the heat sink when it expands as a liquid. Vacuum brazing is performed at a limited number of facilities and typically has a multi-month lead time. In addition, filling these heat sinks with the paraffin wax and inserting seal plugs is usually done at elevated temperatures, such as 90 degrees Celsius or higher, which further increases the difficulty of assembly.

Figure 1:
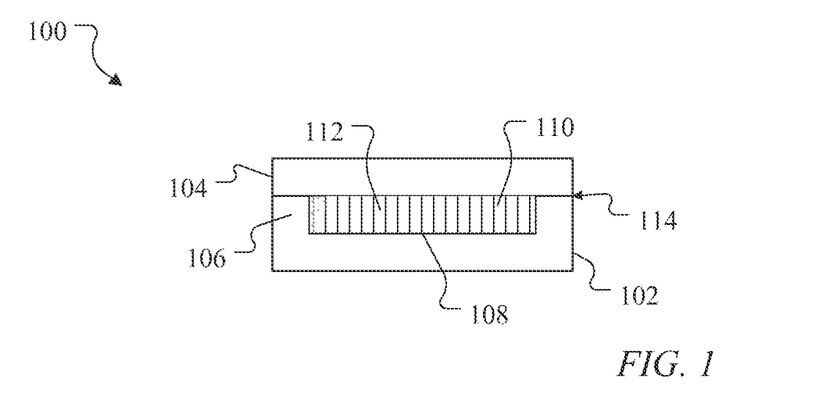
FIG. 1 illustrates an encapsulated phase change material (PCM) heat sink in accordance with the present disclosure.

FIG. 1 illustrates a cross-sectional view of an encapsulated PCM heat sink 100 in accordance with the present disclosure. The embodiment of the encapsulated PCM heat sink 100 shown in FIG. 1 is for illustration only. Other embodiments of the encapsulated PCM heat sink 100 could be used without departing from the scope of this disclosure.

The heat sink 100 comprises a lower shell 102 and an upper shell 104. The lower shell 102 comprises a raised edge 106, which forms a cavity 108 that is configured to accommodate an internal matrix 110 and an encapsulated phase change material 112. The lower shell 102 and the upper shell 104 may be coupled together at an interface 114 between the upper shell 104 and the raised edge 106 of the lower shell 102 to contain the internal matrix 110 and the encapsulated phase change material 112 within the heat sink 100.

The lower shell 102 may comprise aluminum or any other suitable thermally-conductive material. The upper shell 104 may also comprise aluminum or any other suitable thermally-conductive material. Although illustrated as rectangular, it will be understood that the heat sink 100 may comprise any suitable shape, such as circular, oval, triangular, configured to be adjacent a printed circuit board or the like. For example, for some embodiments, the heat sink 100 may be circular. For these embodiments, the lower shell 102 and the upper shell 104 may be substantially circular in shape. In addition, as the shape of the cavity 108 is determined by the raised edge 106, the shape of the internal matrix 110 may be independent of the shape of the shells 102 and 104.

The internal matrix 110 comprises a thermally-conductive material that may be coupled to the lower shell 102 and/or the upper shell 104. In addition, the internal matrix 110 comprises a space that is configured to accommodate the encapsulated phase change material 112. For a particular example, the internal matrix 110 may comprise pins, which may be coupled to or formed with the lower shell 102 and/or the upper shell 104 or to a thermally-conductive component (not shown in FIG. 1) coupled between the lower and upper shells 102 and 104. For another example, the internal matrix 110 may comprise a thermally-conductive foam, such as aluminum foam. Thus, the internal matrix 110 may comprise any suitable form, such as straight, slanted, spiral, zigzag, foam or the like. The thermally-conductive material of the internal matrix 110 is configured to conduct thermal energy into the encapsulated phase change material 112 within the space of the internal matrix 110.

The encapsulated phase change material 112, which is represented by dots in FIG. 1, comprises a coating of a non-phase change material which encapsulates a phase change material. For example, the encapsulated phase change material 112 may comprise a plurality of relatively small glass spheres, each of which encapsulates a relatively small amount of wax powder that absorbs thermal energy when it changes from a solid to liquid state. Thus, the encapsulated phase change material 112 is configured to store and release heat or thermal energy via the phase changes of the phase change material. However, because the phase change material is encapsulated in a non-phase change material, the encapsulated phase change material 112 does not expand or contract with the phase changes. Accordingly, the encapsulated phase change material 112 does not exert pressure on the lower shell 102 or upper shell 104 when the phase change material expands (e.g., for the wax powder embodiment, when the wax powder that is encapsulated melts).

As a result, the need for high-pressure sealing and high-temperature assembly is eliminated, and the lower shell 102 and the upper shell 104 may be coupled together at room temperature and pressure (i.e., without artificially increasing the temperature or pressure of the environment in which the heat sink 100 is being formed) using any suitable sealing technique, such as O-rings, tape or the like. For some embodiments, for example in which the heat sink 100 is circular, the lower shell 102 and the upper shell 104 may comprise complementary threads allowing the shells 102 and 104 to be screwed together. Because neither a high pressure nor a high temperature environment is needed, the process to form the heat sink 100 is significantly less expensive and faster.

In addition, for some embodiments, the internal matrix 110 and encapsulated phase change material 112 together have a lower mass than the material of the lower shell 102 and the upper shell 104. Thus, by using the internal matrix 110 and encapsulated phase change material 112, the mass of the heat sink 100 is reduced as compared to a solid heat sink having the same dimensions but made of the material used for the lower shell 102 and the upper shell 104. As a result, for applications in which mass reduction is desirable, the heat sink 100 allows a decrease in mass while providing similar or better thermal performance.

Although FIG. 1 illustrates one example of an encapsulated PCM heat sink 100, various changes may be made to the embodiment shown in FIG. 1. For example, the makeup and arrangement of the encapsulated PCM heat sink 100 are for illustration only. Components could be added, omitted, combined, subdivided, or placed in any other suitable configuration according to particular needs. For some embodiments, the heat sink 100 may be formed on a mount (not shown in FIG. 1) that allows the heat sink 100 to be more easily incorporated into a particular application.

Figure 2A:
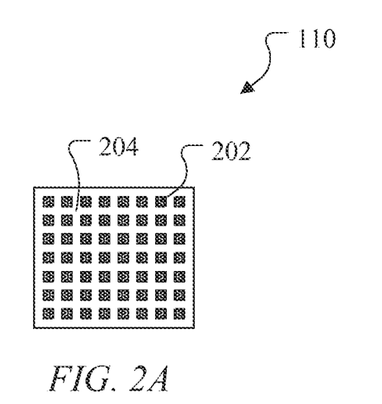
FIGS. 2A-C illustrate examples of the internal matrix of FIG. 1 in accordance with the present disclosure.
Figure 2B:
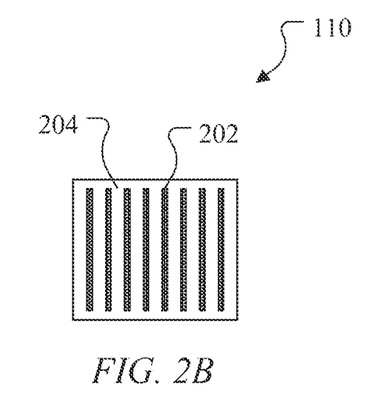
Figure 2C:
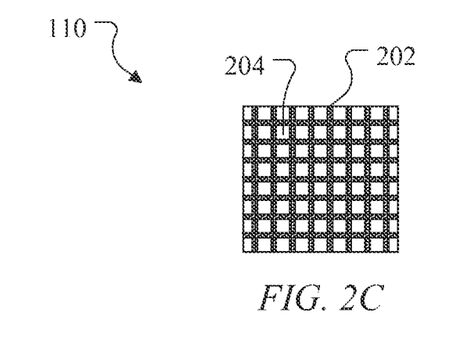

FIGS. 2A-C illustrate examples of the internal matrix 110 in accordance with the present disclosure. The examples of the internal matrix 110 shown in FIGS. 2A-C are for illustration only. Other embodiments of the internal matrix 110 could be used without departing from the scope of this disclosure. For these examples, the internal matrix 110 comprises a thermally-conductive material 202, represented by dark areas, and a space 204, represented by white areas. In addition, the internal matrix 110 is illustrated in a top view.

For the embodiment shown in FIG. 2A, the thermally-conductive material 202 is configured as a plurality of pins. The space 204 comprises a contiguous open area formed by the pins. Although illustrated as square, it will be understood that the pins may alternatively be circular or any other suitable shape. For the embodiment shown in FIG. 2B, the thermally-conductive material 202 is configured as a plurality of plates. The space 204 comprises a contiguous open area formed between the plates. Although illustrated as straight, it will be understood that the plates may alternatively be slanted, zigzag, or any other suitable shape. For the embodiment shown in FIG. 2C, the thermally-conductive material 202 is configured as a grid. The space 204 comprises a non-contiguous open area formed by the grid. Although illustrated as a square grid, it will be understood that the grid may alternatively be formed in any other suitable shape.

FIGS. 3-6, described below, illustrate the formation of specific examples of the encapsulated PCM heat sink 100. However, it will be understood that any suitable configuration of the described components may be implemented without departing from the scope of this disclosure.

Figure 3A:
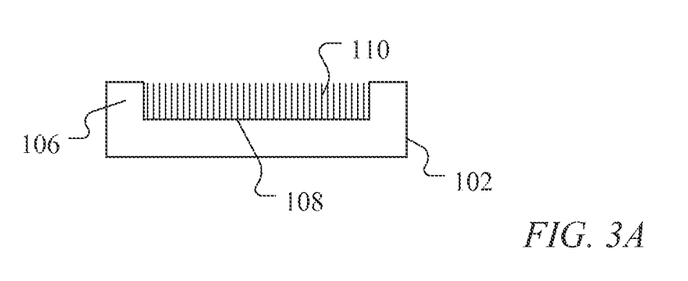
FIGS. 3A-D illustrate a first example of the formation of the PCM heat sink of FIG. 1 in accordance with the present disclosure.

FIGS. 3A-D illustrate the formation of the encapsulated PCM heat sink 100 in accordance with one embodiment of the present disclosure. For this particular example, as shown in FIG. 3A, the lower shell 102 includes an integral internal matrix 110 that comprises pins. The lower shell 102 may be formed together with the internal matrix 110, or the internal matrix 110 may be coupled to the lower shell 102 in the cavity 108 after the lower shell 102 is formed.

Figure 3B:
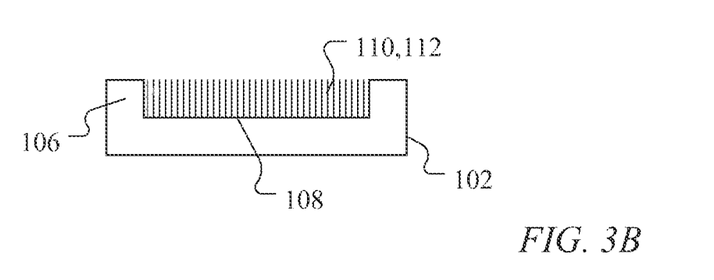

The pins of the internal matrix 110 are configured to conduct heat or thermal energy between the lower shell 102 and the encapsulated phase change material 112, which may be added over the internal matrix 110 so as to substantially fill in the space between the pins, as shown in FIG. 3B. The size and spacing of the pins may be selected based on any suitable criteria, such as the thermal requirements of the application in which the encapsulated PCM heat sink 100 is to be implemented or the like. In addition, although illustrated as straight, the pins may have any suitable configuration, such as spiral, zigzag or the like.

Figure 3C:
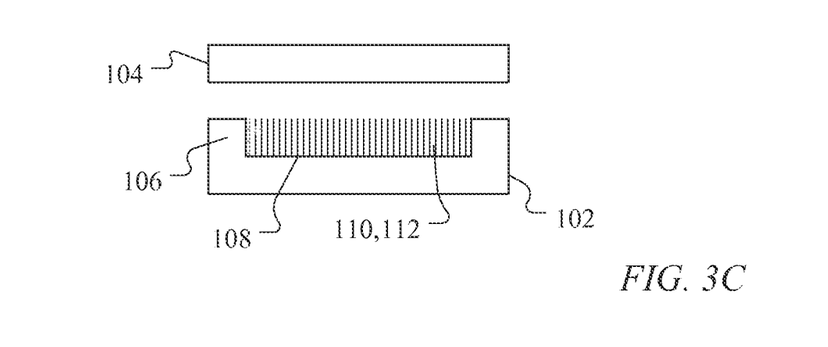
Figure 3D:
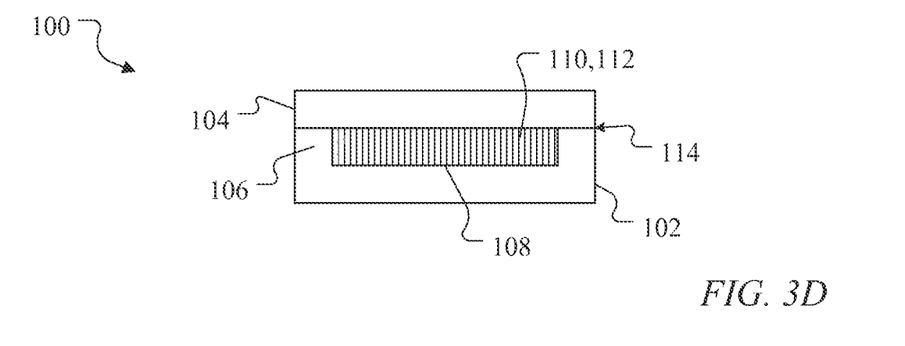

As shown in FIGS. 3C-D, the upper shell 104 may then be added over the lower shell 102, the internal matrix 110 and the encapsulated phase change material 112, and the shells 102 and 104 may be sealed together at the interface 114 in any suitable manner, as described above in connection with FIG. 1, to form the encapsulated PCM heat sink 100. The pins of the internal matrix 110 may also be configured to conduct heat or thermal energy between the upper shell 104 and the encapsulated phase change material 112 once the upper shell 104 is sealed to the lower shell 102.

Figure 4A:
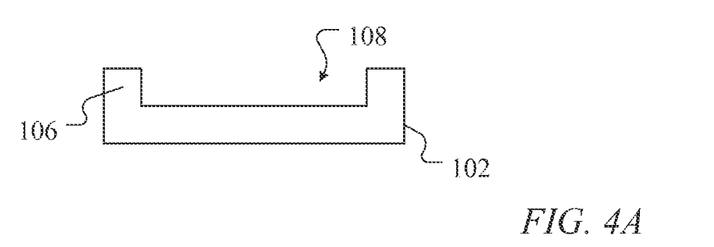
FIGS. 4A-D illustrate a second example of the formation of the PCM heat sink of FIG. 1 in accordance with the present disclosure.
Figure 4B:
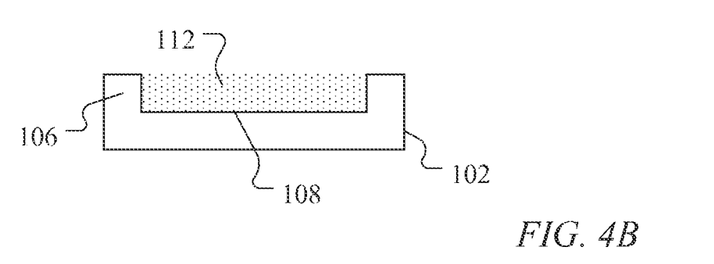

FIGS. 4A-D illustrate the formation of the encapsulated PCM heat sink 100 in accordance with one embodiment of the present disclosure. For this particular example, as shown in FIG. 4A, the lower shell 102 with the cavity 108 formed by the raised edge 106 is provided. The encapsulated phase change material 112 is then added to the cavity 108, as shown in FIG. 4B.

Figure 4C:
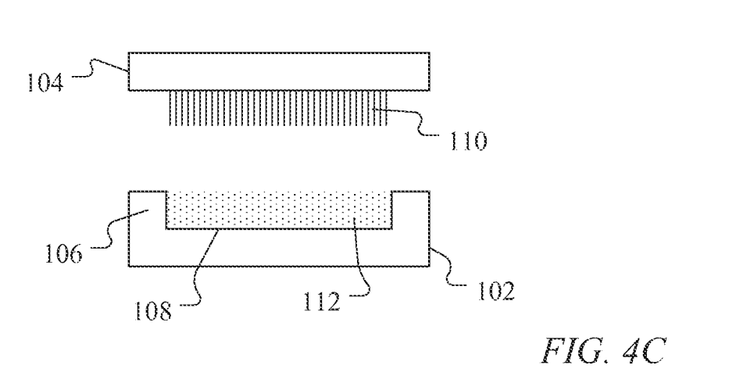

As shown in FIG. 4C, the upper shell 104 includes an integral internal matrix 110 that comprises pins. The upper shell 104 may be formed together with the internal matrix 110, or the internal matrix 110 may be coupled to the upper shell 104 after the upper shell 104 is formed. The pins of the internal matrix 110 are configured to conduct heat or thermal energy between the upper shell 104 and the encapsulated phase change material 112. The size and spacing of the pins may be selected based on any suitable criteria, such as the thermal requirements of the application in which the encapsulated PCM heat sink 100 is to be implemented or the like. In addition, although illustrated as straight, the pins may have any suitable configuration, such as spiral, zigzag or the like.

Figure 4D:
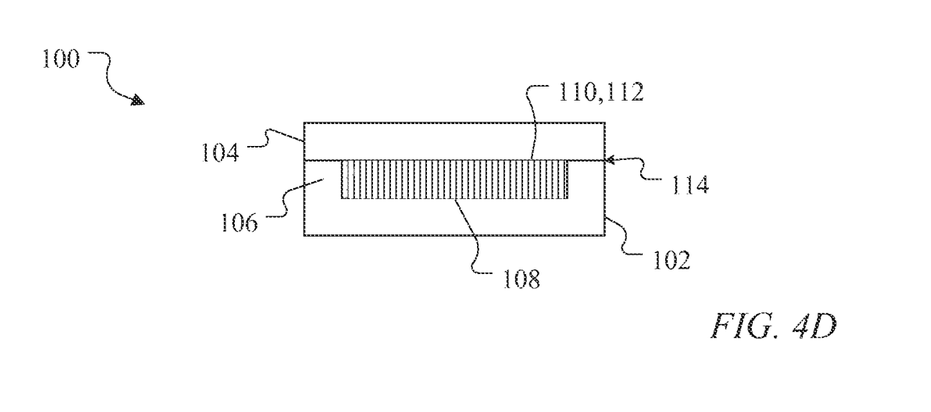

As shown in FIG. 4D, the upper shell 104 with the internal matrix 110 may be added over the lower shell 102 and the encapsulated phase change material 112 such that the encapsulated phase change material 112 substantially fills the space between the pins of the internal matrix 110. The shells 102 and 104 may then be sealed together at the interface 114 in any suitable manner, as described above in connection with FIG. 1, to form the encapsulated PCM heat sink 100. The pins of the internal matrix 110 may also be configured to conduct heat or thermal energy between the lower shell 102 and the encapsulated phase change material 112 once the upper shell 104 is sealed to the lower shell 102.

Figure 5A:
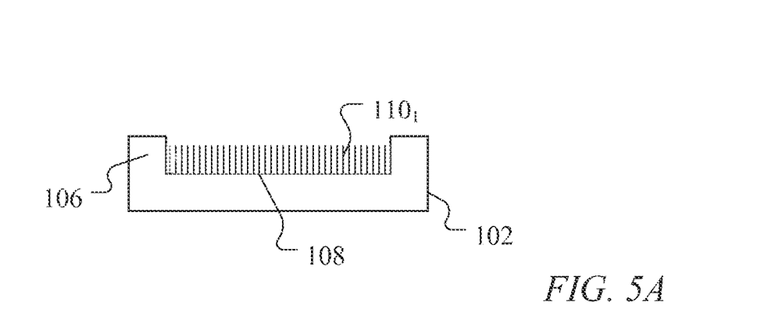
FIGS. 5A-D illustrate a third example of the formation of the PCM heat sink of FIG. 1 in accordance with the present disclosure.

FIGS. 5A-D illustrate the formation of the encapsulated PCM heat sink 100 in accordance with one embodiment of the present disclosure. For this particular example, the internal matrix 110 comprises a lower internal matrix $110_1$ and an upper internal matrix $110_2$. As shown in FIG. 5A, the lower shell 102 includes an integral, lower internal matrix $110_1$ that comprises pins. The lower shell 102 may be formed together with the lower internal matrix $110_1$, or the lower internal matrix $110_1$ may be coupled to the lower shell 102 in the cavity 108 after the lower shell 102 is formed.

Figure 5B:
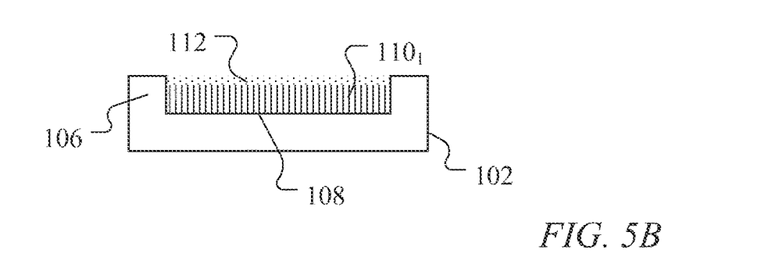

The pins of the lower internal matrix $110_1$ are configured to conduct heat or thermal energy between the lower shell 102 and the encapsulated phase change material 112, which may be added over the lower internal matrix $110_1$ so as to substantially fill in the space between and above the pins, as shown in FIG. 5B. The size and spacing of the pins may be selected based on any suitable criteria, such as the thermal requirements of the application in which the encapsulated PCM heat sink 100 is to be implemented or the like. In addition, although illustrated as straight, the pins may have any suitable configuration, such as spiral, zigzag or the like.

Figure 5C:
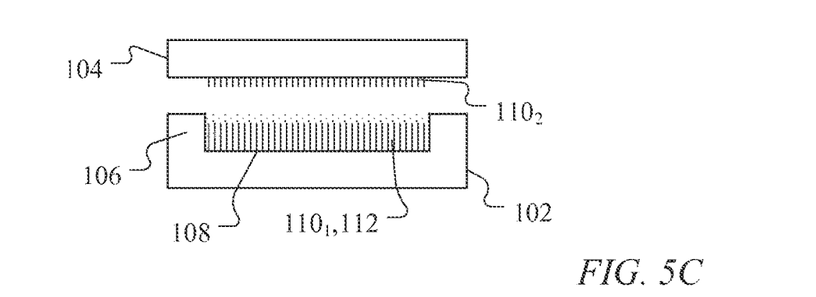

As shown in FIG. 5C, the upper shell 104 includes an integral, upper internal matrix $110_2$ that comprises pins. The upper shell 104 may be formed together with the upper internal matrix $110_2$, or the upper internal matrix $110_2$ may be coupled to the upper shell 104 after the upper shell 104 is formed. The pins of the upper internal matrix $110_2$ are configured to conduct heat or thermal energy between the encapsulated phase change material 112 and the upper shell 104. The size and spacing of the pins may be selected based on any suitable criteria, such as the thermal requirements of the application in which the encapsulated PCM heat sink 100 is to be implemented, the size and spacing of the pins of the lower internal matrix $110_1$ or the like. It will be understood that the size and spacing of the pins of the upper internal matrix $110_2$ may be different from or the same as the size and spacing of the pins of the lower internal matrix $110_1$. In addition, although illustrated as straight, the pins of the upper internal matrix $110_2$ may also have any suitable configuration, such as spiral, zigzag or the like.

Figure 5D:
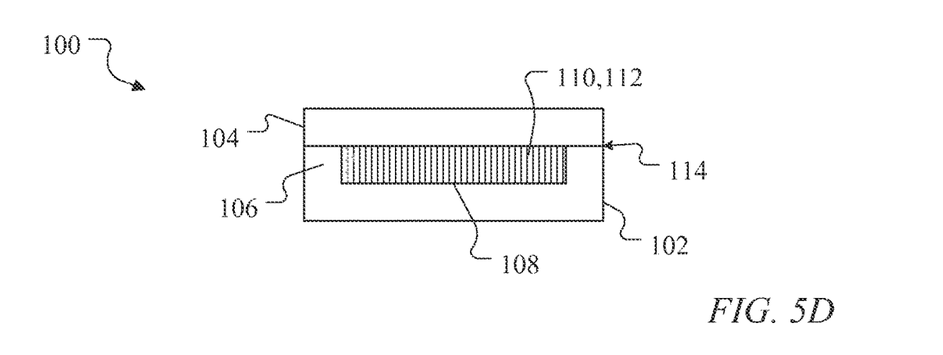

As shown in FIGS. 5C-D, the upper shell 104 and the upper internal matrix $110_2$ may be added over the lower shell 102, the lower internal matrix $110_1$ and the encapsulated phase change material 112 such that the encapsulated phase change material 112 above the lower internal matrix $110_1$ substantially fills the space between the pins of the upper internal matrix $110_2$. Although the pins of the lower internal matrix $110_1$ and the pins of the upper internal matrix $110_2$ are illustrated as aligned, it will be understood that these pins may be offset from each other instead, allowing the pins to be of the same length as the pins in FIGS. 3A and 4C or any other suitable length. For some of these embodiments, encapsulated phase change material 112 would not be added above the tops of the pins of the lower internal matrix $110_1$.

As shown in FIG. 5D, the upper shell 104 may be coupled to the lower shell 102 by sealing the shells 102 and 104 together at the interface 114 in any suitable manner, as described above in connection with FIG. 1, to form the encapsulated PCM heat sink 100.

Figure 6A:
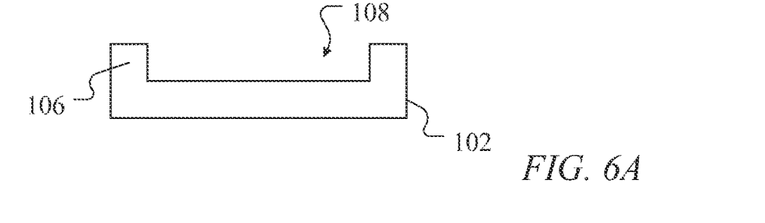
FIGS. 6A-E illustrate a fourth example of the formation of the PCM heat sink of FIG. 1 in accordance with the present disclosure.

FIGS. 6A-E illustrate the formation of the encapsulated PCM heat sink 100 in accordance with one embodiment of the present disclosure. For this particular example, as shown in FIG. 6A, the lower shell 102 with the cavity 108 formed by the raised edge 106 is provided.

Figure 6B:
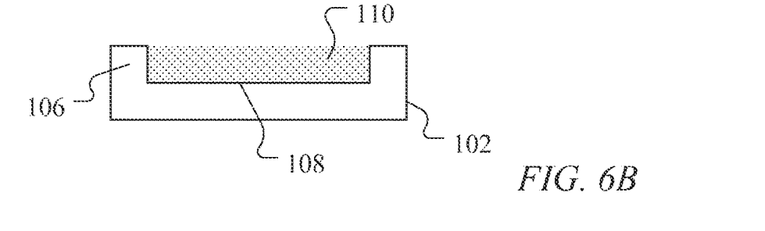
Figure 6C:
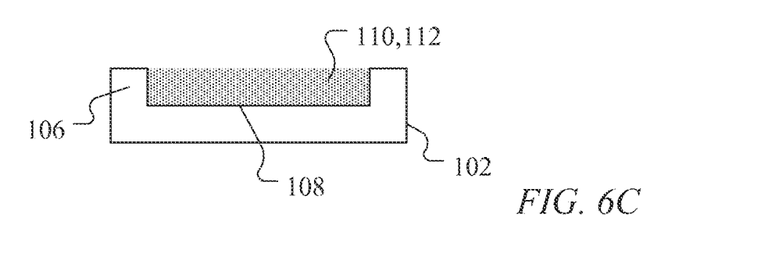

The internal matrix 110, which is represented by dots in FIGS. 6B-E, is then added to the cavity 108, as shown in FIG. 6B. Instead of pins, in this example, the internal matrix 110 may comprise aluminum foam or any other suitable type of thermally-conductive foam. The encapsulated phase change material 112 is then added to the space in the internal matrix 110, as shown in FIG. 6C.

Figure 6D:
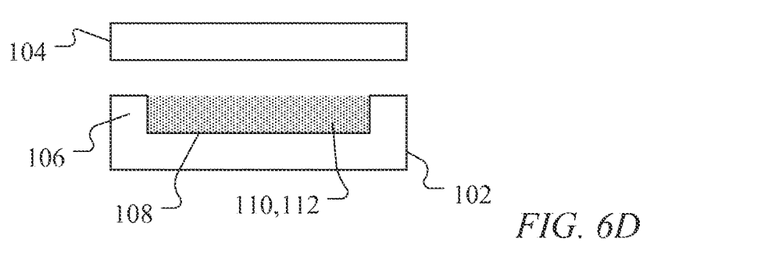
Figure 6E:
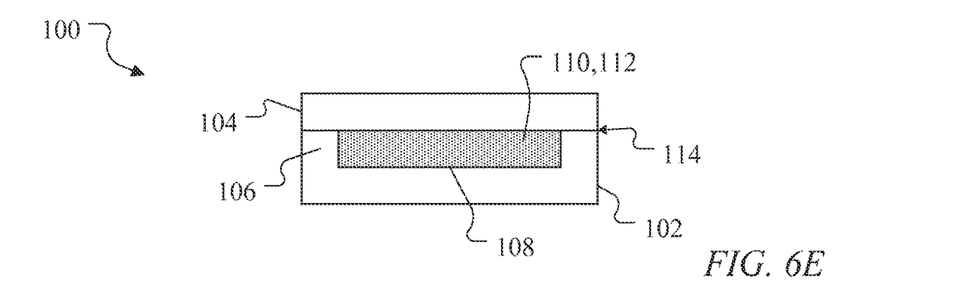

As shown in FIGS. 6D-E, the upper shell 104 may be added over the lower shell 102, the internal matrix 110 and the encapsulated phase change material 112, and the shells 102 and 104 may be sealed together at the interface 114 in any suitable manner, as described above in connection with FIG. 1, to form the encapsulated PCM heat sink 100. Thus, after the upper shell 104 is sealed to the lower shell 102, the internal matrix 110 is configured to conduct heat or thermal energy between the encapsulated phase change material 112 and either or both of the lower shell 102 and the upper shell 104.

Figure 7:
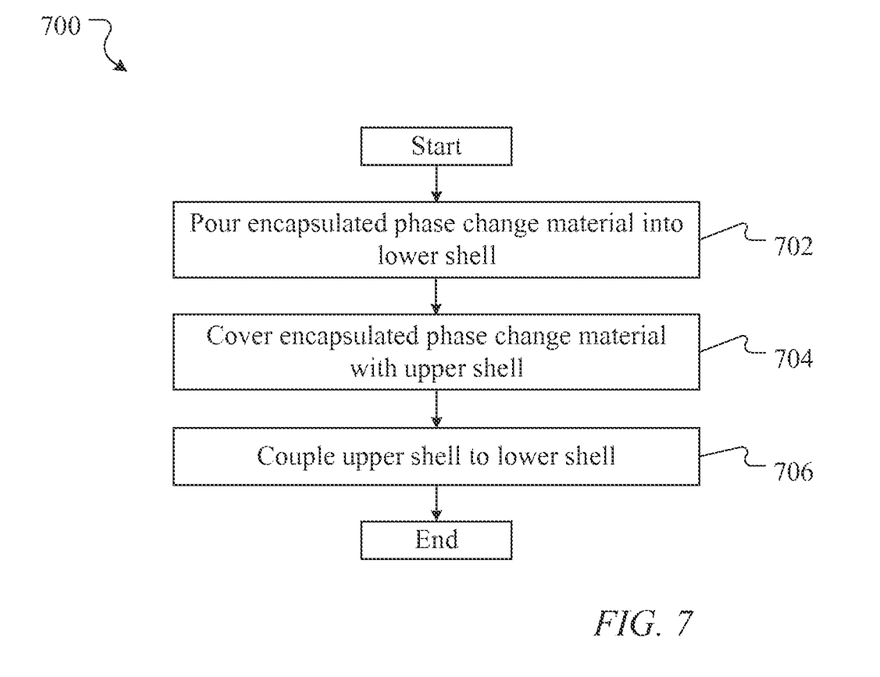
FIG. 7 is a flowchart illustrating a method for forming the PCM heat sink of FIG. 1 in accordance with the present disclosure.

FIG. 7 is a flowchart illustrating a method 700 for forming the encapsulated PCM heat sink 100 in accordance with the present disclosure. The method 700 shown in FIG. 7 is for illustration only. The encapsulated PCM heat sink 100 may be formed in any other suitable manner without departing from the scope of this disclosure.

Initially, the encapsulated phase change material 112 is inserted into the lower shell 102 (step 702). For a particular example, for some embodiments, encapsulated wax powder may be inserted into the cavity 108 in the lower shell 102 (as shown in FIG. 4B), into the space of the internal matrix 110 in the lower shell 102 (as shown in FIG. 3B or 6C), or into the space of, and over, the lower internal matrix $110_1$ in the lower shell 102 (as shown in FIG. 5B).

The encapsulated phase change material 112 is then covered with the upper shell 104 (step 704). For a particular example, for some embodiments, encapsulated wax powder and the internal matrix 110 may be covered with the upper shell 104 (as shown in FIG. 3C or 6D), encapsulated wax powder may be covered with the upper shell 104, which includes the internal matrix 110 (as shown in FIG. 4C), or encapsulated wax powder and the lower internal matrix $110_1$ may be covered with the upper shell 104, which includes the upper internal matrix $110_2$ (as shown in FIG. 5C).

The upper shell 104 is then coupled to the lower shell 102 to complete the encapsulated PCM heat sink 100 (step 706). For example, the upper shell 104 may be coupled to the lower shell 102 at the interface 114 between the shells 102 and 104 without using high-pressure or high-temperature sealing techniques. Thus, neither vacuum brazing nor high pressure seal plugs are necessary. Instead, the shells 102 and 104 may be coupled together using fasteners, threads, O-rings, tape or any other suitable room temperature and pressure technique. As a result, the encapsulated PCM heat sink 100 may be formed using a process that is significantly less expensive and faster as compared to conventional PCM heat sinks while still providing the benefit of reduced mass as compared to solid metal heat sinks.

Although FIG. 7 illustrates one example of a method 700 for forming the encapsulated PCM heat sink 100, various changes may be made to FIG. 7. For example, while shown as a series of steps, various steps in FIG. 7 could overlap, occur in parallel, occur in a different order, or occur multiple times.

Modifications, additions, or omissions may be made to the apparatuses, and methods described herein without departing from the scope of the disclosure. For example, the components of the apparatuses may be integrated or separated. The methods may include more, fewer, or other steps. Additionally, as described above, steps may be performed in any suitable order.

It may be advantageous to set forth definitions of certain words and phrases used throughout this patent document. The term "couple" and its derivatives refer to any direct or indirect communication between two or more elements, whether or not those elements are in physical contact with one another. The terms "include" and "comprise," as well as derivatives thereof, mean inclusion without limitation. The term "or" is inclusive, meaning and/or. The term "each" refers to each member of a set or each member of a subset of a set. Terms such as "over" and "under" may refer to relative positions in the figures and do not denote required orientations during manufacturing or use. Terms such as "higher" and "lower" denote relative values and are not meant to imply specific values or ranges of values. The phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like.

While this disclosure has described certain embodiments and generally associated methods, alterations and permutations of these embodiments and methods will be apparent to those skilled in the art. Accordingly, the above description of example embodiments does not define or constrain this disclosure. Other changes, substitutions, and alterations are also possible without departing from the spirit and scope of this disclosure, as defined by the following claims.

What is claimed is:

1. An encapsulated phase change material (PCM) heat sink, comprising:
    a lower shell comprising a first set of threads;
    an upper shell comprising a second set of threads that are complementary to the first set of threads, wherein the lower shell and the upper shell are screwed together using the first and second sets of threads;
    an encapsulated phase change material comprising a wax powder encapsulated in a plurality of glass spheres, the glass spheres configured to not change phase as the wax powder changes phase; and
    an internal matrix comprising a lower internal matrix and an upper internal matrix, the lower internal matrix comprising a first plurality of pins integral to the lower shell, the upper internal matrix comprising a second plurality of pins integral to the upper shell, the first plurality of pins not aligned with the second plurality of pins, the internal matrix disposed within a space, wherein the space is configured to receive the encapsulated phase change material and wherein thermal energy is transferrable between the encapsulated phase change material and at least one of the lower shell and the upper shell.

2. The encapsulated PCM heat sink of claim 1, wherein the upper shell and the lower shell are screwed together at ambient temperature and pressure.

3. The encapsulated PCM heat sink of claim 1, wherein the lower shell comprises a raised edge configured to form a cavity, and wherein the cavity is configured to receive the internal matrix and the encapsulated phase change material.

4. The encapsulated PCM heat sink of claim 1, wherein the glass spheres are configured to not substantively expand or contract with phase changes of the wax powder.

5. The encapsulated PCM heat sink of claim 1, wherein the first plurality of pins are integrated into the lower shell in a two-dimensional matrix arrangement.

6. The encapsulated PCM heat sink of claim 1, wherein the encapsulated phase change material is disposed in the space up to a level no higher than tops of the pins of the lower internal matrix.

7. The encapsulated PCM heat sink of claim 1, wherein each of the glass spheres encapsulates a respective portion of the wax powder.

8. An encapsulated phase change material (PCM) heat sink, comprising:
    an encapsulated wax powder comprising a wax powder encapsulated in a plurality of glass spheres, the glass spheres configured to not change phase as the wax powder changes phase;
    an internal matrix disposed within a space, wherein the space is configured to receive the encapsulated wax powder;
    a lower shell comprising a raised edge configured to form a cavity, wherein the cavity is configured to receive the internal matrix and the encapsulated wax powder, the lower shell further comprising a first set of threads; and
    an upper shell comprising a second set of threads that are complementary to the first set of threads, wherein the upper shell and the raised edge of the lower shell are screwed together using the first and second sets of threads;
    wherein the internal matrix comprises a lower internal matrix and an upper internal matrix, the lower internal matrix comprising a first plurality of pins integral to the lower shell, the upper internal matrix comprising a second plurality of pins integral to the upper shell, the first plurality of pins not aligned with the second plurality of pins.

9. The encapsulated PCM heat sink of claim 8, wherein the upper shell and the raised edge of the lower shell are screwed together at ambient temperature and pressure.

10. The encapsulated PCM heat sink of claim 8, wherein each of the glass spheres encapsulates a respective portion of the wax powder.

11. The encapsulated PCM heat sink of claim 8, wherein the glass spheres are configured to not substantively expand or contract with phase changes of the wax powder.

12. The encapsulated PCM heat sink of claim 8, wherein the first plurality of pins are integrated into the lower shell in a two-dimensional matrix arrangement.

13. The encapsulated PCM heat sink of claim 8, wherein the encapsulated wax powder is disposed in the space up to a level no higher than tops of the pins of the lower internal matrix.

14. A method for forming an encapsulated PCM heat sink, comprising:
    inserting an encapsulated phase change material into a lower shell, the encapsulated phase change material comprising a wax powder encapsulated in a plurality of glass spheres, the glass spheres configured to not change phase as the wax powder changes phase, the lower shell comprising a lower internal matrix comprising a first plurality of pins and a first set of threads;
    covering the encapsulated phase change material with an upper shell, the upper shell comprising an upper internal matrix comprising a second plurality of pins not aligned with the first plurality of pins, wherein the encapsulated phase change material is received within a space in which an internal matrix is disposed, the internal matrix including the upper internal matrix and the lower internal matrix, the upper shell further comprising a second set of threads that are complementary to the first set of threads; and
    screwing the upper shell and the lower shell together at ambient temperature and pressure using the first and second sets of threads.

15. The method of claim 14, further comprising forming the lower internal matrix in the lower shell, wherein inserting the encapsulated phase change material into the lower shell comprises inserting the encapsulated phase change material into the space surrounding the lower internal matrix.

16. The method of claim 14, further comprising forming the upper internal matrix in the upper shell.

17. The method of claim 14, wherein the encapsulated phase change material is inserted into the lower shell up to a level no higher than tops of the pins of the lower internal matrix.

18. The method of claim 14, wherein the lower shell comprises a raised edge configured to foil a cavity, and wherein the cavity is configured to receive the internal matrix and the encapsulated phase change material.

19. The method of claim 14, wherein the first plurality of pins are integrated into the lower shell in a two-dimensional matrix arrangement.

20. The method of claim 14, wherein the glass spheres are configured to not substantively expand or contract with phase changes of the wax powder.

* * * * *